United States Patent
Wieber et al.

(10) Patent No.: US 9,234,281 B2
(45) Date of Patent: Jan. 12, 2016

(54) METHOD FOR PRODUCING SILICON LAYERS

(75) Inventors: Stephan Wieber, Karlsruhe (DE); Matthias Patz, Bottrop (DE); Reinhard Carius, Jülich (DE); Torsten Bronger, Aachen (DE); Michael Cölle, Haltern am See (DE)

(73) Assignee: Evonik Degussa GmbH, Essen (DE)

( * ) Notice: Subject to any disclaimer, the term of this patent is extended or adjusted under 35 U.S.C. 154(b) by 152 days.

(21) Appl. No.: 13/510,373

(22) PCT Filed: Nov. 10, 2010

(86) PCT No.: PCT/EP2010/067207
§ 371 (c)(1),
(2), (4) Date: Jul. 12, 2012

(87) PCT Pub. No.: WO2011/061106
PCT Pub. Date: May 26, 2011

(65) Prior Publication Data
US 2012/0273805 A1    Nov. 1, 2012

(30) Foreign Application Priority Data

Nov. 18, 2009   (DE) .......................... 10 2009 053 806

(51) Int. Cl.
*B32B 9/00*   (2006.01)
*H01L 21/00*   (2006.01)
(Continued)

(52) U.S. Cl.
CPC ............ *C23C 18/1204* (2013.01); *C08G 77/60* (2013.01); *C09D 183/16* (2013.01); *C23C 18/122* (2013.01); *C23C 18/1225* (2013.01); *C23C 18/1229* (2013.01);
(Continued)

(58) Field of Classification Search
CPC .................. H01L 21/02628; H01L 21/02532; H01L 21/0237; H01L 21/02205; H01L 21/02211
See application file for complete search history.

(56) References Cited

U.S. PATENT DOCUMENTS 5,700,400 A   12/1997  Ikai et al.
5,866,471 A    2/1999  Beppu et al.
(Continued)

FOREIGN PATENT DOCUMENTS

EP   1 087 428    3/2001
JP   7 267621    10/1995
(Continued)

OTHER PUBLICATIONS

U.S. Appl. No. 13/989,823, filed May 28, 2013, Wieber, et al.
(Continued)

*Primary Examiner* — Su C Kim
(74) *Attorney, Agent, or Firm* — Oblon, McClelland, Maier & Neustadt, L.L.P.

(57) ABSTRACT

The invention relates to a liquid-phase method for the thermal production of silicon layers on a substrate, wherein at least one higher silicon that can be produced from at least one hydridosilane of the generic formula $Si_aH_{2a+2}$ (with a=3-10) being applied to a substrate and then being thermally converted to a layer that substantially consists of silicon, the thermal conversion of the higher silane proceeding at a temperature of 500-900° C. and a conversion time of ≤5 minutes. The invention also relates to silicon layers producible according to said method and to their use.

20 Claims, 2 Drawing Sheets

Layer of a higher silane which has been produced from neopentasilane

(51) Int. Cl.
*C23C 18/12* (2006.01)
*C23C 18/14* (2006.01)
*H01L 21/02* (2006.01)
*C08G 77/60* (2006.01)
*C09D 183/16* (2006.01)

(52) U.S. Cl.
CPC ............ *C23C 18/1295* (2013.01); *C23C 18/14* (2013.01); *H01L 21/0237* (2013.01); *H01L 21/02532* (2013.01); *H01L 21/02628* (2013.01)

(56) References Cited

U.S. PATENT DOCUMENTS

| | | | |
|---|---|---|---|
| 8,092,867 B2* | 1/2012 | Karshtedt et al. | 427/387 |
| 2003/0045632 A1 | 3/2003 | Shiho et al. | |
| 2004/0255848 A1 | 12/2004 | Yudasaka | |
| 2006/0185712 A1 | 8/2006 | Shiho et al. | |
| 2008/0022897 A1* | 1/2008 | Zurcher et al. | 106/287.14 |
| 2008/0087217 A1 | 4/2008 | Yudasaka | |
| 2009/0093094 A1* | 4/2009 | Ye et al. | 438/197 |
| 2011/0189072 A1 | 8/2011 | Brausch et al. | |
| 2011/0268642 A1 | 11/2011 | Brausch et al. | |
| 2012/0042951 A1 | 2/2012 | Stuetzel et al. | |
| 2012/0205654 A1 | 8/2012 | Stuetzel et al. | |
| 2012/0214005 A1 | 8/2012 | Wieber et al. | |
| 2013/0168824 A1 | 7/2013 | Wieber et al. | |

FOREIGN PATENT DOCUMENTS

| | | |
|---|---|---|
| JP | 2009-259958 | 11/2009 |
| WO | WO 2003/090266 | 10/2003 |

OTHER PUBLICATIONS

U.S. Appl. No. 13/824,641, filed Mar. 18, 2013, Wieber, et al.
U.S. Appl. No. 13/991,261, filed Jun. 3, 2013, Stenner, et al.
U.S. Appl. No. 13/885,316, filed May 14, 2013, Stenner, et al.
U.S. Appl. No. 13/991,986, filed Jun. 6, 2013, Brausch, et al.
International Search Report Issued Jul. 1, 2011 in PCT/EP10/67207 Filed Nov. 10, 2010.
U.S. Appl. No. 13/574,376, filed Jul. 20, 2012, Wieber, et al.
U.S. Appl. No. 13/498,206, filed Mar. 26, 2012, Brausch, et al.
U.S. Appl. No. 14/435,528, filed Apr. 14, 2015, Traut, et al.
Office Action issued Aug. 3, 2015, in Japanese patent application No. 2012-539271 (English translation only).

* cited by examiner

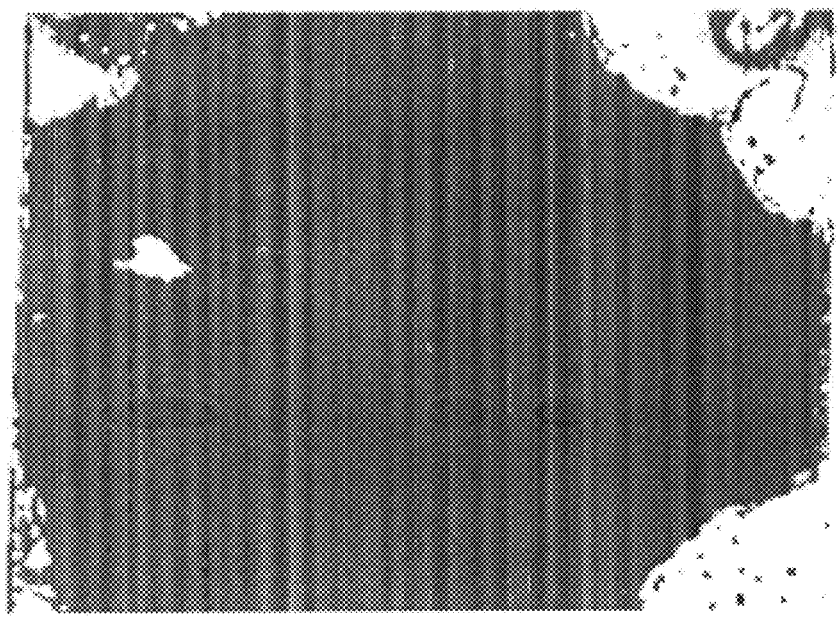
Figure 1: Layer of a higher silane which has been produced from neopentasilane Figure 2: Layer of a higher silane which has been produced from cyclopentasilane

METHOD FOR PRODUCING SILICON LAYERS

The invention relates to a liquid phase process for production of silicon layers from higher silanes which are preparable from noncyclic silanes.

The synthesis of silicon layers is of great significance for the semiconductor industry, especially for the production of electronic or optoelectronic component layers, for example for use in solar cells, photodiodes and transistors.

It is possible in principle to produce silicon layers via various processes. Among these, however, sputtering techniques have the disadvantage that they have to be performed under high vacuum. Gas phase deposition processes have the further disadvantage that they require i) the use of very high temperatures in the case of a thermal reaction regime or ii) high energy densities in the case of introduction of the energy required for the decomposition of the precursor in the form of electromagnetic radiation. In both cases, it is possible only with a very high level of apparatus complexity to introduce the energy required to decompose the precursor in a controlled and homogeneous manner. Since the other processes for production of silicon layers are also disadvantageous, silicon layers are thus preferably formed via depositions from the liquid phase.

In such liquid phase processes for production of silicon layers, liquid reactants (optionally functioning as solvents for further additives and/or dopants) or liquid solutions containing the reactants (which are themselves liquid or solid) (and optionally further additives and/or dopants) are applied to the substrate to be coated, and then converted thermally and/or with electromagnetic radiation to a silicon layer.

Reactants usable with preference here are hydridosilanes. These compounds consist essentially of silicon and hydrogen atoms and have the advantage that they react on conversion to give deposited silicon (possibly with a residual hydrogen content beneficial for the electronic properties) and gaseous hydrogen.

The prior art includes in particular liquid phase processes for production of silicon layers from cyclic silanes (including Spiro compounds) or from higher silanes (oligomers) which are preparable from cyclic silanes (including spiro compounds).

For example, EP 1 134 224 A2 describes a process for producing silicon films on the surface of a substrate, in which a solution containing cyclopentasilane and silylcyclopentasilane or spiro[4.4]nonasilane is applied to a substrate surface to form a coating film, and the coating film is subsequently converted to a silicon film by heating. In this process, it was found that silylcyclopentasilane and spiro[4.4]nonasilane have the property of functioning as free-radical polymerization initiators for cyclopentasilane or polymerizing themselves with ring opening, such that it is possible to use silylcyclopentasilane and spiro[4.4]nonasilane or mixtures thereof with cyclopentasilane, optionally after preceding irradiation with UV light, to produce silicon layers via thermal processes (thermal conversion). The thermal conversion times described are 30 s to 30 minutes at temperatures of more than 300° C., preferably 400-500° C.

The ring-opening polymerization of the cyclic compounds used forms essentially linear oligomers. These essentially linear oligomers are, however, disadvantageous for the silicon layer production since they can be used only within a very narrow molar mass range: too low a molecular weight leads to poor or no wetting. Too great a molecular weight leads to unstable compositions from which excessively large oligomers precipitate and with which good wetting and homogeneous layers cannot be obtained. As well as the liquid phase processes mentioned for production of silicon layers from cyclic silanes or higher silanes (oligomers) preparable therefrom, the prior art also describes liquid phase processes for production of silicon layers from linear silanes (optionally in combination with cyclic silanes) or higher silanes (oligomers) preparable therefrom in each case.

For instance, JP 07-267621 A describes a process for thermal preparation of a silicon layer on a substrate, in which liquid silanes of the formula $Si_mH_{2m+2}$ (where m≥5) or $Si_nH_{2n}$ (where n≥4) are used. The silicon layers producible by the process described therein may be amorphous or polycrystalline. The conversion temperatures described therein are temperatures of 200-550° C. to achieve amorphous silicon layers. Above 550° C., polycrystalline layers should be the result. Below 200° C., the conversion to silicon is said to be incomplete. The examples describe conversion times of 30 minutes (300° C.; 350° C.; 450° C.) and 60 minutes (700° C.).

JP 09-045922 A also describes a process for producing polycrystalline silicon layers on a substrate, in which silanes of the formula $Si_mH_{2m+2}$ (where m≥5) or $Si_nH_{2n}$ (where n≥4) are used for irradiation processes. The conversion temperatures described therein are temperatures of 200-550° C. Below 200° C., the conversion to silicon is said to be incomplete. The examples describe conversion times of 30 minutes in a hydrogen plasma (350° C.; 480° C.).

U.S. Pat. No. 5,866,471 A describes, inter alia, the use of linear or cyclic hydridosilanes and silyl group-substituted linear or cyclic hydridosilanes, which can be decomposed thermally to give a semiconductor film. The substances mentioned are solid at room temperature, soluble in organic solvents and preferably have a degree of polymerization of 3-10 000, more preferably 5-30. They are additionally preferably thermally decomposed from 200 to 700° C., the hardening times being from 10 minutes to 10 hours.

U.S. Pat. No. 5,700,400 A describes processes for producing semiconductive materials, in which hydrosilane monomers are subjected to a dehydrogenating condensation, the intermediate of which is subsequently decomposed thermally. The hydrosilane monomer may be a monosilane, disilane or trisilane derivative. The thermal decomposition is effected at temperatures of 200-1000° C., preferably 200-700° C. The conversion times specified in the examples are from one hour (700° C.) to 24 hours (200° C.).

EP 1 085 560 A1 teaches using cyclic silane compounds of the formula $Si_nX_m$ (where n≥5 and m=n, 2n−2 or 2n) and/or modified silanes of the formula $Si_aX_bY_c$ (where a≥3, b=a to 2a+c+2, c=1 to a) for production of silicon films using heat and/or light. This can give either amorphous or polycrystalline layers. It is possible to achieve amorphous layers after drying by conversion temperatures of up to 550° C., and polycrystalline layers by conversion temperatures higher than 550° C. after drying. The examples describe conversion times of 30 minutes (300° C.).

EP 1 085 579 A1 describes processes for producing solar cells, in which liquid compositions containing silanes are used and are converted with heat, light and/or laser treatment. The liquid coating compositions may contain a solvent and a cyclic silicon compound of the formula $Si_nX_m$ (X=H, Hal, n≥5, m=n, 2n−n, 2n) or a modified silane compound of the formula $Si_aX_bY_c$ (X=H, Hal, Y=B, P, a≥3, c=1 to a and b=a to 2a+c+2). The conversion of the coating compositions to silanes can follow by means of a conversion step which follows a drying step. As a typical drying temperature, a range of 100-200° C. is specified. Here too, it is stated that only from 300° C. is a significant conversion to silicon layers the result, that an amorphous layer is the result from 300° C. to 550° C., and that polycrystalline layers are the result from 550° C. Conversion times are not reported.

EP 1 087 428 A1 describes ink compositions containing a silicon precursor with which a silicon film can be produced by means of printing processes. The silicon precursors described therein are compounds of the formula (I) $Si_nX_m$ (where n≥3, m=n, 2n−2, 2n or 2n+2 and X=H and/or Hal) or (II) $Si_aX_bY_c$ (where X=H and/or Hal, Y=B, P, a≥3, b=a to 2a+c+2, c=1 to a), which can be used individually or in a mixture. Cyclic compounds of the formula (I) are preferred. Silicon films can be produced by using heat and/or light. When heat is used, the conversion is typically performed at temperatures of 100-800° C. This can give either amorphous or polycrystalline layers. Amorphous layers can be achieved by conversion temperatures of up to 550° C., and polycrystalline layers by conversion temperatures higher than 550° C. Below 300° C. there is no conversion. The conversion times described in the examples are times of 30 minutes.

EP 1 357 154 A1 describes compositions "of higher silanes" which contain a polysilane which is producible by irradiating a photopolymerizable silane with UV radiation. The photopolymerizable silane may be a silane of the general formula $Si_nX_m$ (where n≥3, m≥4, X=H, Hal), compounds specified by way of example are cyclic silanes of the formula $Si_nX_{2n}$, bi- or polycyclic structures of the formula $Si_nH_{2n-2}$, and other silanes with a cyclic structure in the molecule, which exhibit an extremely high reactivity to light and photopolymerize efficiently. The compositions of the "higher silane" can be converted to a silicon film on a substrate by thermal decomposition or photodecomposition. For this purpose, the moist film is dried by heat (typically 100-200° C.) and then converted by heat and/or light. Amorphous films can be obtained by thermal treatment at temperatures of less than 550° C.; at higher temperatures, the result is polycrystalline films. The examples report conversion times of 10 minutes (350° C., 400° C., 500° C.).

JP 2004-134440 A1 is concerned with the irradiation of silane compositions in the context of silicon layer production. The silane compositions for use may be (i) silanes of the formula $Si_nR_m$ where n≥11 and m=n to (2n+2), where R may be H, or (ii) silanes of the formula $Si_nH_{2i+2}$ (where i=2-10), $Si_jH_{2j}$ (where j=3-10) or $Si_kH_k$ (where k=6, 8 or 10), in each case in combination with at least one silane selected from the group comprising cyclopentasilane, cyclohexasilane and silylcyclopentasilane. The silanes described may each be catenated, cyclic or in the form of cages. The irradiation time is from about 0.1 to 30 minutes, and the temperature in the course of irradiation may be from room temperature to 300° C. This process gives a silicon film former, which can be converted to a silicon film by temperatures of 100-1000° C., preferably 200-850° C., more preferably 300-500° C. Here too, the result is polycrystalline silicon layers when conversion temperatures of greater than 550° C. are selected. Below 300° C., film formation is incomplete. The examples are conversion times of 30 minutes (400° C.), 60 minutes (300° C., 250° C.).

However, a common feature of all these processes described is that they lead to poor optical and electrical properties. A measure for the optical and electrical properties of a silicon layer, more particularly as a measure for the photoconductivity thereof, may be the absorption coefficient α, which can be determined within the mid-gap range (for aSi at 1.2 eV) via PDS analyses. It is generally the case that a low α value correlates with good electrical and optical properties, and a high α value with poor electrical and optical properties. This α value can be considered to be a measure for the frequency of states within the band gap (mid-gap states) within the resulting layer. States within the band gap (mid-gap states) are electronic states within the band gap which worsen the electrical properties of semiconductor materials, for example the photoconductivity and the lifetime of the charge carriers, since they act as traps for electrons and thus, for example, reduce the yield of charge carriers which contribute to the photocurrent. These states are often unsaturated silicon bonds ('dangling bonds').

It is thus an object of the present invention to provide a liquid phase process for producing silicon layers, which avoids the cited disadvantages of the prior art. More particularly, a liquid phase process for production of silicon layers should be provided, in which the formulations used are stable and wet the substrate efficiently, and which leads to homogeneous silicon layers with better electrical and optical properties. It would also be particularly advantageous to be able to produce aSi:H layers with a lower absorption coefficient α (determinable at 1.2 eV for aSi:H via PDS measurements).

This object is achieved in the present case by the liquid phase process according to the invention for thermal production of silicon layers on a substrate, in which at least one higher silane preparable from at least one hydridosilane of the generic formula $Si_aH_{2a+2}$ (where a=3-10) is applied to a substrate and then converted thermally to a layer comprising essentially silicon, wherein the higher silane is thermally converted at a temperature of 500-900° C. with a conversion time of 5 minutes. Surprisingly, this also makes silicon layers obtainable with particularly good purity.

A liquid phase process for thermal production of silicon layers is understood in the present context to mean a process in which liquid reactants (optionally functioning as solvents for further additives and/or dopants) or liquid solutions containing the reactants (which are themselves liquid or solid) (and optionally further additives and/or dopants; the latter especially in the form of element compounds of main groups III and V) are applied to the substrate to be coated and then converted thermally (optionally supported by electromagnetic radiation) to a layer comprising essentially silicon. The reactant used in the present case is at least one higher silane preparable from at least one hydridosilane of the generic formula $Si_aH_{2a+2}$ (where a=3-10). Hydridosilanes of the generic formula $Si_aH_{2a+2}$ (where a=3-10) are noncyclic, i.e. linear or branched, hydridosilanes. Corresponding processes for preparing higher silanes are known to those skilled in the art. Examples include photochemical, anionic, cationic or catalytic polymerization processes. Among these, preference is given to initiating and performing the free-radical polymerization process by irradiation with UV radiation, the irradiation time correlating with the mean molecular weight which arises. What is common to all polymerization processes mentioned is that they proceed dissociatively unlike the ring-opening polymerization described for cyclic silanes, i.e. they lead, owing to the dissociative reaction mechanism and the dissociated intermediates or states formed intermediately, on average to higher silanes having a relatively high content of branching and/or crosslinking. Experience has shown that a higher silane preparable from at least one hydridosilane of the generic formula $Si_aH_{2a+2}$ (where a=3-10) via a polymerization process does not have a homogeneous molecular weight. "A higher silane" in the context of the present invention is thus understood to mean a silane which is preparable from at least one defined silane of the generic formula $Si_aH_{2a+2}$ (where a=3-10) via a dissociative polymerization process and has an elevated mean molecular weight compared to the reactants used, attributable to the polymerization process selected.

In the process according to the invention, preference is given to using a higher silane which has a weight-average molecular weight of 330-10 000 g/mol measured by means of GPC. The weight-average molecular weight of the higher silane is further preferably 330-5000 g/mol, even further preferably 600-4000 g/mol, measured by means of GPC.

The at least one higher silane may, if it is liquid itself, be applied to the substrate without further dissolution in a solvent. However, the higher silane preferably applied to the substrate dissolved in a solvent.

Usable with preference are solvents from the group comprising linear, branched or cyclic, saturated, unsaturated or aromatic hydrocarbons having one to 12 carbon atoms (optionally partially or fully halogenated), alcohols, ethers, carboxylic acids, esters, nitriles, amines, amides, sulphoxides and water. Particular preference is given to n-pentane, n-hexane, n-heptane, n-octane, n-decane, dodecane, cyclohexane, cyclooctane, cyclodecane, dicyclopentane, benzene, toluene, m-xylene, p-xylene, mesitylene, indane, indene, tetrahydronaphthalene, decahydronaphthalene, diethyl ether, dipropyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, tetrahydrofuran, p-dioxane, aceto-nitrile, dimethylformamide, dimethyl sulphoxide, dichloromethane and chloroform. Solvents with particularly good usability are the hydrocarbons n-pentane, n-hexane, n-hexane, n-octane, n-decane, dodecane, cyclohexane, cyclooctane, cyclodecane, benzene, toluene, m-xylene, p-xylene, mesitylene, indane and indene.

When the at least one higher silane is used in a solvent, the percentage by weight thereof is preferably at least 5% by weight, based on the total mass of this composition. When the at least one higher silane is applied to the substrate without further dissolution in a solvent, the percentage by weight thereof, according to whether it itself serves as a solvent for further additives and/or dopants, is preferably from 70 to 100% by weight, based on the total mass of the composition. Preference is thus given to using the at least one higher silane in a proportion of 5-100% by weight, based on the total mass of the composition containing it. Particularly thin layers can be achieved when compositions having a proportion of the at least one higher silane of 10-50% by weight are used.

To achieve positive layer properties, together with the at least one higher silane preparable from a hydridosilane of the generic formula $Si_aH_{2a+2}$, it is also possible to apply at least one dopant selected from the group of the compounds of the elements of main group III or V to the substrate. Corresponding compounds are known to those skilled in the art. Dopants usable with preference are boron compounds of the $BH_xR_{3-x}$ type where x=1-3 and R=$C_1$-$C_{10}$-alkyl radical, unsaturated cyclic, optionally ether- or amine-complexed $C_2$-$C_{10}$-alkyl radical, compounds of the formulae $Si_5H_9BR_2$ (R=H, Ph, $C_1$-$C_{10}$-alkyl radical) and $Si_4H_9BR_2$ (R=H, Ph, $C_1$-$C_{10}$-alkyl radical), red phosphorus, white phosphorus ($P_4$), compounds of the formula $PH_xR_{3-x}$ where x=0-3 and R=Ph, $SiMe_3$, $C_1$-$C_{10}$-alkyl radical, and compounds of the formulae $P_7(SiR_3)_3$ (R=H, Ph, $C_1$-$C_{10}$-alkyl radical), $Si_5H_9PR_2$ (R=H, Ph, $C_1$-$C_{10}$-alkyl radical) and $Si_4H_9PR_2$ (R=H, Ph, $C_1$-$C_{10}$-alkyl radical).

For the process according to the invention, it is possible to use a multitude of substrates. Preference is given to substrates comprising glass, quartz glass, graphite or metal. Further preferred metals are aluminium, stainless steel, Cr steel, titanium, chromium and molybdenum. It is also possible to use polymer films, for example of PEN, PET or polyimides. Likewise further preferred are heat-compatible metal foils, optionally with a layer which serves as a diffusion barrier for the metal (e.g. carbon, $Si_3N_4$) and a conductive layer (e.g. TCO, ZnO, $SnO_2$, ITO—or metals) on the diffusion barrier layer. The diffusion barriers used may be Al, $SiO_x$, $Al_xO_y$, and also Pt, Pd, Rh and Ni. Particularly suitable are the oxides of Ti, Al and Zr, and the nitrides of Ti and Si.

Likewise preferably, the substrate used may be a silicon substrate or a silicon layer, indium tin oxide (ITO) layer, ZnO:F layer or $SnO_2$:F (FTO) layer present on a heat-compatible carrier.

The higher silane is preferably applied by means of a process selected from printing processes (especially flexographic/gravure printing, inkjet printing, offset printing, digital offset printing and screen printing), spraying processes, rotary coating processes ("spin-coating"), dipping processes ("dip-coating"), and processes selected from meniscus coating, slit coating, slot-die coating and curtain coating.

After the coating and before the conversion, the coated substrate can be dried further in order to remove any solvent present. Corresponding measures and conditions therefor are known to those skilled in the art. In order to remove exclusively solvent, the heating temperature should not be more than 250° C. in the case of thermal drying.

The conversion of the process according to the invention is effected at temperatures of 500-900° C. and conversion times of ≤5 minutes. This comparatively rapid thermal process regime can be accomplished, for example, by the use of an IR lamp, of a hotplate, of an oven, of a flash lamp, of an RTP system or of a microwave system (if required, in the preheated or warmed-up state in each case). Particularly good optical and electrical layer properties can be achieved when the conversion temperature is 500-650° C.

The conversion time is preferably 0.1 ms to 120 s. To achieve particularly good optical and electrical layer properties, a conversion time of 0.1-60 s should be selected.

The quality of the resulting layer is also positively influenced when the thermal conversion is effected within a single thermal process step, i.e. the substrate is, preferably after an initial conversion, not removed from the heat source and then reheated.

The quality of the resulting layer can also be positively influenced when UV radiation is injected before, during or after the thermal treatment. These positive effects are at their greatest when UV radiation is injected after the application of the higher silane and before the conversion thereof. Typical irradiation times are from 1 to 20 minutes.

Better layers can also be achieved when a reduced pressure (down to vacuum) is applied after the application of the higher silane and before the conversion thereof. Preferred reduced pressures are $1·10^{-3}$ mbar to 0.5 bar. The coated substrate is more preferably treated at the reduced pressure over a duration of 1 to 20 minutes.

In the case of production of multiple layers, for example in the case of tandem solar cells, the same time/temperature limit (thermal budget) should be complied with overall. In other words, the sum of all temperature steps >500° C. should preferably be kept <5 min.

The process according to the invention is particularly suitable for production of amorphous silicon layers. Ways and means of obtaining these in a corresponding manner are known to those skilled in the art. An amorphous silicon layer is understood to mean a layer whose Raman spectrum has only one peak with a peak maximum in the range of 450 $cm^{-1}$-500 $cm^{-1}$ and an FWHM (full-width half-maximum) of 50-100 $cm^{-1}$. The invention thus also provides a liquid phase process for thermal production of amorphous silicon layers on a substrate, in which at least one higher silane preparable from at least one hydridosilane of the generic formula $Si_aH_{2a+2}$ (where a=3-10) is applied to a substrate and then converted thermally to a layer comprising essentially silicon, wherein the higher silane is thermally converted at a temperature of 500-900° C. with a conversion time of ≤5 minutes.

The invention further provides the silicon layer producible by the process according to the invention.

The invention likewise provides for the use of the silicon layers producible by the process according to the invention for production of electronic or optoelectronic component layers, especially for photovoltaic applications or in transistors.

The examples which follow are intended to provide further additional illustration of the subject-matter of the invention.

EXAMPLES

All operations are conducted with exclusion of $O_2$ in an $N_2$ glovebox.

A. Synthesis of the Higher Silanes

Example 1

Material for Inventive Use 3 ml of neopentasilane in a weighing bottle are irradiated with a UV lamp until a weight-average molecular weight of approx. $M_w$=900 g/mol is attained.

Example 2

Material for Comparative Example 3 ml of cyclopentasilane in a weighing bottle are irradiated with a UV lamp until a weight-average molecular weight of approx. $M_w$=2200 g/mol is attained.

B. Layer Production

Example 1

50 µl of a 37.5% by weight formulation of the oligomerized silane obtained in the above experimental Example 1 in cyclooctane are applied dropwise to a glass substrate of size 2.5×2.5 cm², and rotated at 2000 rpm by means of a spin-coater. The resulting film is hardened on a hotplate at 600° C. for 20 sec. A brown Si layer of thickness approx. 130 nm is obtained (cf. FIG. 1). PDS data show an alpha value at 1.2 eV of 103 cm$^{-1}$, Raman data show 100% amorphous aSi:H.

Comparative Example 1

50 µl of a 37% by weight formulation of the oligomerized silane obtained in the above experimental Example 1 in cyclooctane are applied dropwise to a glass substrate of size 2.5×2.5 cm², and rotated at 2000 rpm by means of a spin-coater. The resulting film is hardened on a hotplate at 400° C. for 10 min. A brown Si layer of thickness approx. 140 nm is obtained. PDS data show an alpha value at 1.2 eV of 120 cm$^{-1}$, Raman data show 100% amorphous aSi:H.

Comparative Example 2

50 µl of a 28.5% by weight formulation of the oligomerized silane obtained in the above experimental Example 2 in cyclooctane are applied dropwise to a glass substrate of size 2.5×2.5 cm², and rotated at 6000 rpm by means of a spin-coater. The resulting film is hardened on a hotplate at 400° C. for 10 min. A brown Si layer of thickness approx. 142 nm is obtained. PDS data show an alpha value at 1.2 eV of 172 cm$^{-1}$, Raman data show 100% amorphous aSi:H.

Comparative Example 3

3 ml of cyclopentasilane in a weighing bottle are irradiated with a UV lamp until a weight-average molecular weight of approx. $M_w$=3100 g/mol is attained. 50 µl of a 37.5% by weight formulation of the resulting oligomerized silane in cyclooctane are applied dropwise to a glass substrate of size 2.5×2.5 cm² and rotated at 2500 rpm by means of a spin-coater. The resulting film is hardened on a hotplate at 500° C. for 60 sec (cf. FIG. 2).

The invention claimed is:

1. A process for producing a silicon layer on a substrate, the process comprising:
   (a) applying at least one higher silane obtained from neopentasilane $Si(SiH_3)_3$ to a substrate to form an applied layer; and then
   (b) thermally converting the applied layer to a product layer comprising silicon,
   wherein the thermally converting (b) occurs at a temperature of from 500 to 900° C.; and in a conversion time of ≤5 minutes.

2. The process of claim 1, wherein the at least one higher silane has a weight-average molecular weight of from 330 to 10,000 g/mol.

3. The process of claim 1, wherein the at least one higher silane is dissolved in a solvent.

4. The process of claim 1, wherein a proportion of from 5 to 100% by weight of the at least one higher silane is applied to the substrate, based on a total mass of a composition comprising the at least one higher silane.

5. The process of claim 1, wherein the at least one higher silane is applied to the substrate together with at least one dopant selected from the group consisting of a compound comprising a group III element and a compound comprising a group V element.

6. The process of claim 1, wherein the substrate comprises glass, quartz glass, graphite, metal, plastic, silicon, or a silicon, indium tin oxide, ZnO:F or SnO$_2$:F layer on a heat-compatible carrier.

7. The process of claim 1, wherein the applying (a) occurs by a process selected from the group consisting of a printing process, a spraying process, a rotary coating process, a dipping process, meniscus coating, slit coating, slot-die coating and curtain coating.

8. The process of claim 1, wherein the thermally converting (b) occurs at a temperature of from 500 to 650° C.

9. The process of claim 1, wherein the conversion time is from 0.1 ms to 120 s.

10. The process of claim 1, wherein the thermally converting (b) is a single thermal process step.

11. The process of claim 1, further comprising applying UV radiation to the substrate before, during or after the thermally converting (b).

12. The process of claim 1, further comprising reducing the pressure after the applying (a) and before the thermally converting (b).

13. A silicon layer obtained by the process of claim 1.

14. An electronic or optoelectronic component layer comprising the silicon layer of claim 13.

15. The process of claim 1, wherein the conversion time is from 0.1 to 60 s.

16. The process of claim 1, comprising first polymerizing the neopentasilane $Si(SiH_3)_3$ to obtain at least one higher silane having a molecular weight of 330-10,000 g/mol and then applying the at least one higher silane to a substrate.

17. The process of claim 1, the thermal conversion time is from 0.1 msec to 120 sec.

18. The process of claim 1, the thermal conversion time is from 0.1 sec to 120 sec.

19. The process of claim 1, the thermal conversion time is from 0.1 sec to 60 sec.

20. The process of claim 1, the thermal conversion time is from 20 sec to 120 sec.

* * * * *